(12) United States Patent
Leong et al.

(10) Patent No.: US 10,720,913 B1
(45) Date of Patent: Jul. 21, 2020

(54) INTEGRATED FAILSAFE PULLDOWN CIRCUIT FOR GAN SWITCH

(71) Applicant: Infineon Technologies Austria AG, Villach (AT)

(72) Inventors: Kennith Kin Leong, Villach (AT); Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/423,314

(22) Filed: May 28, 2019

(51) Int. Cl.
*H03K 17/0814* (2006.01)

(52) U.S. Cl.
CPC .............................. *H03K 17/08142* (2013.01)

(58) Field of Classification Search
USPC .................................................. 327/108–112
See application file for complete search history.

(56) References Cited

U.S. PATENT DOCUMENTS

| | | | | |
|---|---|---|---|---|
| 6,316,956 B1* | 11/2001 | Oglesbee | ............. | H02J 7/0029 323/225 |
| 7,952,418 B2* | 5/2011 | McDonald | ........... | H03K 17/145 327/108 |
| 8,760,219 B2* | 6/2014 | Chao | ...................... | G11C 5/147 327/540 |
| 9,209,787 B2* | 12/2015 | Shelton | ............. | H03K 17/0822 |
| 9,305,917 B1 | 4/2016 | Curatola et al. | | |
| 9,595,950 B1 | 3/2017 | Seok | | |
| 9,853,637 B1* | 12/2017 | Meiser | ..................... | H03K 7/08 |
| 2006/0238927 A1 | 10/2006 | Morbe et al. | | |
| 2007/0081280 A1 | 4/2007 | Strzalkowski et al. | | |
| 2010/0060326 A1* | 3/2010 | Palmer | ............. | H03K 17/08148 327/109 |
| 2010/0118458 A1* | 5/2010 | Coffey | ................... | H02H 9/004 361/65 |
| 2010/0205614 A1* | 8/2010 | Harrington | ...... | G01R 19/16576 719/318 |
| 2011/0273258 A1 | 11/2011 | Duplessis et al. | | |

(Continued)

OTHER PUBLICATIONS

Coccia, A., et al., "Wide input Voltage range Compensation in DC/DC Resonant Architectures for On-Board Traction Power Supplies", IEEE 2007 European Conference on Power Electronics and Applications, Sep. 2-5, 2007, 1-10.

*Primary Examiner* — Adam D Houston
(74) *Attorney, Agent, or Firm* — Murphy, Bilak & Homiller, PLLC (57) ABSTRACT

Circuits and devices are provided for reliably holding a normally-off Gallium Nitride (GaN) power transistor, such as a Gate Injection Transistor (GIT), in a non-conducting state when a gate of the power transistor is not driven with an active (turn-on) control signal. This is accomplished by coupling a normally-on pulldown transistor between the gate and the source of the power transistor, such that the pulldown transistor shorts the gate to the source when the power transistor is not set for its conducting state. The pulldown transistor is preferably located on the same semiconductor die as, and in close proximity to, the power transistor, so as to avoid spurious noise at the power transistor gate that may unintentionally turn on the power transistor. A pulldown control circuit is coupled to the gate of the pulldown transistor and autonomously turns off the pulldown transistor when the power transistor is set to conduct.

23 Claims, 6 Drawing Sheets

(56) References Cited

U.S. PATENT DOCUMENTS

| | | | |
|---|---|---|---|
| 2012/0158188 A1* | 6/2012 | Madala | G01F 23/243 |
| | | | 700/276 |
| 2014/0167724 A1 | 6/2014 | Deng et al. | |
| 2015/0171852 A1 | 6/2015 | Pang | |
| 2015/0228353 A1 | 8/2015 | Qing et al. | |
| 2015/0255547 A1* | 9/2015 | Yuan | H01L 29/7788 |
| | | | 257/76 |
| 2015/0318851 A1* | 11/2015 | Roberts | H01L 25/18 |
| | | | 327/109 |
| 2015/0344335 A1* | 12/2015 | Hughes | C02F 1/487 |
| | | | 204/661 |
| 2016/0072376 A1 | 3/2016 | Ahlers et al. | |
| 2016/0087622 A1* | 3/2016 | Kaeriyama | H03K 17/0828 |
| | | | 327/109 |
| 2016/0142048 A1* | 5/2016 | Zoels | H02M 1/08 |
| | | | 327/109 |
| 2017/0040312 A1 | 2/2017 | Curatola et al. | |
| 2017/0331471 A1 | 11/2017 | Yuzurihara et al. | |
| 2019/0123215 A1 | 4/2019 | Stark | |
| 2019/0372567 A1* | 12/2019 | Yoshida | H03K 17/08 |

\* cited by examiner

INTEGRATED FAILSAFE PULLDOWN CIRCUIT FOR GAN SWITCH

TECHNICAL FIELD

The present application relates to a circuit topology and an integrated power switch device that include a failsafe circuit for reliably holding a normally-off Gallium Nitride (GaN) transistor, or similar, in a non-conducting state when a gate of the GaN transistor is not being driven with an active (turn-on) control signal.

BACKGROUND

Gallium Nitride (GaN) based switches, and other similar High Electron Mobility Transistors (HEMTs) based on heterojunctions, provide high voltage support, low drain-to-source on resistance, low gate-drive charge requirements, and fast switching. As a result of these characteristics, GaN-based switches are increasingly being used in applications that require high efficiency and high-frequency support, including, notably, switching power converters. However, some GaN-based switches have unique gate-drive requirements, as compared with conventional metal-oxide semiconductor field-effect transistors (MOSFETs) and bipolar junction transistors (BJTs), and typically require complex gate-drive circuitry.

A GaN-based switch in its native state is a normally-on (depletion-mode) device. Such a device conducts current from its drain to its source when no voltage is applied to its gate, relative to its source, and requires application of a negative voltage to its gate to force the device into a non-conducting (blocking) state. Such normally-on behavior is unsuitable for most applications. Hence, modifications to GaN-based switches have been developed so as to convert them into normally-off (enhancement-mode) devices. For example, a p-doped GaN layer introduced between the gate metal and the heterostructure of a GaN-based switch has the effect of raising the switch's turn-on/off voltage threshold to a positive value, thereby providing a normally-off device. Enhancement-mode switches based on such a gate structure are known as Gate Injection Transistors (GITs).

GaN-based GITs have a relatively low threshold voltage for switching between their conducting (on) and blocking (off) states. This threshold voltage is typically in the range of 1.2 to 3.5V, which is significantly lower than corresponding thresholds, e.g., 5V, for other power MOSFETs. Additionally, HEMTs, including GaN-based GITs, have low gate-to-source and gate-to-drain capacitances, which are notably smaller than corresponding capacitances in other power MOSFETs. While the low threshold voltage and low gate capacitance of a GaN-based GIT advantageously provide fast switching speeds and low gate charge requirements, these characteristics also make a GaN-based GIT susceptible to being undesirably turned on due to voltage perturbations at the gate of the GIT during intervals when the GIT is intended to be held in its non-conducting (blocking) state. For example, noise at the gate could cause its voltage to rise above the GIT's threshold voltage, though the gate is intended to be held at a low voltage. Such noise may occur during operational intervals when the GIT is intended to be held in its non-conducting state, and during start-up intervals during which the gate may not yet be provided with a driven control signal. Additionally, the gate voltage may be susceptible to ringing after the control voltage is transitioned from a high (turn-on) voltage level to a low (turn-off) voltage level. The voltage level of the ringing can exceed the GIT's threshold voltage, thereby unintentionally turning on the GIT.

The above problems are conventionally addressed using complex circuitry customized for driving GaN-based GITs or similar enhancement-mode HEMTs. Such circuitry typically drives a negative voltage onto the gate to turn off the GIT, thereby providing significant margin between the driven gate voltage and the turn-on threshold voltage of the GIT. This margin allows the GaN-based GIT to be reliably held in its non-conducting (blocking) state. A resistor-capacitor (RC) circuit is often included in the driving circuitry, so as to provide high current when the GaN-based GIT is initially transitioned to a conducting state. Lower current is provided subsequently to maintain the conducting state of the GIT. The RC circuit additionally has the effect of applying a relatively high magnitude of the negative voltage when the GaN-based GIT is transitioned off, and this negative voltage dissipates towards zero as the off interval proceeds. Typical driving circuitry, as described above, includes at least two and as many as four driver switches, each of which must be controlled, and provides three or four voltage levels to the gate.

The typical GIT driver circuitry described above has many problems. First, the negative voltage provided at the gate during the turn-off interval leads to a large required voltage swing when the GIT is transitioned to its conducting state, thereby slowing the transition and the potential switching speed of the GIT. Second, the RC-based dissipation means that the level of the negative voltage will vary according to the switching duty cycle, thereby leading to transition times that are inconsistent, which complicates the use and control of the GIT. Third, while the negative voltage described above reliably holds the GIT off during steady-state operation, spurious non-zero voltage during an initial start-up interval, before the negative voltage is driven to the gate, may undesirably turn on the GIT. Fourth, the negative voltage adds an offset to the effective reverse body diode voltage, thereby increasing the threshold voltage of the effective reverse body diode and increasing associated losses. Lastly, the driver circuitry is quite complex, and requires fairly complex control of switches within the driver circuit itself.

SUMMARY

Circuits and power switch devices that incorporate GaN-based GITs, or similar, are provided. These circuits and devices are configured such that may be driven by drivers that are simpler than existing drivers for GaN-based GITs, and that do not require use of a negative gate voltage to safely hold a GIT in its non-conducting state. Such configurations address the above-described problems, and allow for use of a relatively simple two-level driver for driving a power switch device that includes a GaN-based GIT.

According to an embodiment of a power device, the power device includes a normally-off power transistor, first and second load terminals, a control terminal, an effective Kelvin-source terminal, and a failsafe pulldown circuit. The first load terminal is electrically connected to a drain of the power transistor, the second load terminal is electrically connected to a source of the power transistor, and the control terminal is electrically connected to a gate of the power transistor. The failsafe pulldown circuit comprises a normally-on pulldown transistor and a pulldown control circuit for controlling the pulldown transistor. The pulldown transistor has a pulldown gate, a pulldown source and a pulldown drain, and is configured to short the power transistor gate to the power transistor source, unless a turn-on voltage of the power device is applied across the control terminal and the KS terminal. The pulldown control circuit is connected between the pulldown gate and the pulldown source, and is configured to autonomously apply a negative voltage to the pulldown gate, relative to the pulldown source, when a turn-on voltage is applied between the control and the effective Kelvin-source terminals. The pulldown control circuit is further configured to autonomously discharge the negative voltage when the turn-on voltage is not applied between the control and Kelvin-source terminals.

According to an embodiment of an electronic switch device, the switch device includes a normally-off power transistor, first and second load terminals, a control terminal, an effective Kelvin-source terminal, and a failsafe pulldown circuit. The first load terminal is electrically connected to a drain of the power transistor, the second load terminal is electrically connected to a source of the power transistor, and the control terminal is electrically connected to a gate of the power transistor. The power transistor and the failsafe pulldown circuit are integrated on the same semiconductor die. The failsafe pulldown circuit comprises a normally-on pulldown transistor and a pulldown control circuit for controlling the pulldown transistor. The pulldown transistor has a pulldown gate, a pulldown source and a pulldown drain, and is configured to short the power transistor gate to the power transistor source, unless a turn-on voltage of the power device is applied across the control terminal and the KS terminal. The pulldown control circuit is connected between the pulldown gate and the pulldown source, and is configured to autonomously apply a negative voltage to the pulldown gate, relative to the pulldown source, when a turn-on voltage is applied between the control and the effective Kelvin-source terminals. The pulldown control circuit is further configured to autonomously discharge the negative voltage when the turn-on voltage is not applied between the control and the effective Kelvin-source terminals.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

The embodiments described herein provide circuits and devices that include a failsafe pulldown for the gate of a power switch. While the described examples use a Gallium Nitride (GaN) based Gate Injection Transistor (GIT) as the power switch, the techniques are applicable to other transistor or semiconductor types including, notably, other enhancement-mode High Electron Mobility Transistors (HEMTs) characterized in having low turn on/off threshold voltages and low gate capacitances. The failsafe pulldown prevents the power switch from being unintentionally turned on due to spurious noise or ringing, and does not require use of a negative voltage at the gate of the power switch. Many of the problems associated with applying a negative voltage to the power switch gate are, thus, avoided.

The embodiments are described primarily in the context of a power switch device in which a failsafe pulldown circuit and a power switch (e.g., a GIT) are integrated in the same GaN semiconductor die. However, the die could similarly be comprised of some other group III/V semiconductor or a silicon-based semiconductor. The described integration of the failsafe pulldown circuit and the power switch presents significant advantages in reliably maintaining a desired turn-off (non-conducting) state of the power switch. In particular, such integration minimizes parasitic inductances between the gate of the power switch and the failsafe pulldown circuit, thereby constraining voltage ringing that potentially occurs when the control voltage driven to the gate transitions between high and low voltage levels. The reduced ringing effectively clamps the power switch's gate-to-source voltage close to zero during turn-off intervals, which prevents unintended turning on of the power switch. Integration of the failsafe pulldown circuit in close proximity to the power switch also reduces interconnect paths (e.g., traces, terminals), thereby minimizing the potential for noise to couple onto the gate. This also prevents unintentional turning on of the power switch, particularly when no drive signal is applied to the gate as occurs during start-up intervals.

While the embodiments are described primarily in the context of an integrated power switch device including both a failsafe pulldown circuit and a power switch, the failsafe pulldown circuit and the power switch may be provided on separate dies, i.e., may not be monolithically integrated. Such a solution provides improvement over prior circuitry for controlling a GIT, but may not achieve the significant advantage of reduced noise (improved reliability) that is provided by an integrated power device.

The failsafe pulldown circuit and the power switch may be provided on separate dies that are integrated within the same package, i.e., within a system-in-package or multi-chip module. Such a system-in-package achieves reduced parasitics and improved reliability as compared with a solution spread across separate packages, but may not achieve the same level of performance as a solution wherein the failsafe pulldown circuit and the power switch are integrated on the same die.

The power switch device may be controlled by a driver that is considerably simpler than typical drivers used for controlling GITs, and that notably avoids complex switching sequences (state machines) within the driver and circuitry for generating a negative voltage. Furthermore, the power switch device may be controlled using only two voltage levels, rather than the three or four voltage levels typically required for driving a GIT. The failsafe pulldown circuit requires no separate control signalling, and is effectively controlled using the same two-level voltage signal that drives the gate of the power switch (GIT). Hence, the drivers used to control the power devices (GITs) described herein may be similar to other gate drivers, including those used in driving conventional MOSFETs. Examples of drivers that may be used in conjunction with the power switch devices herein are described further below.

Figure 1:
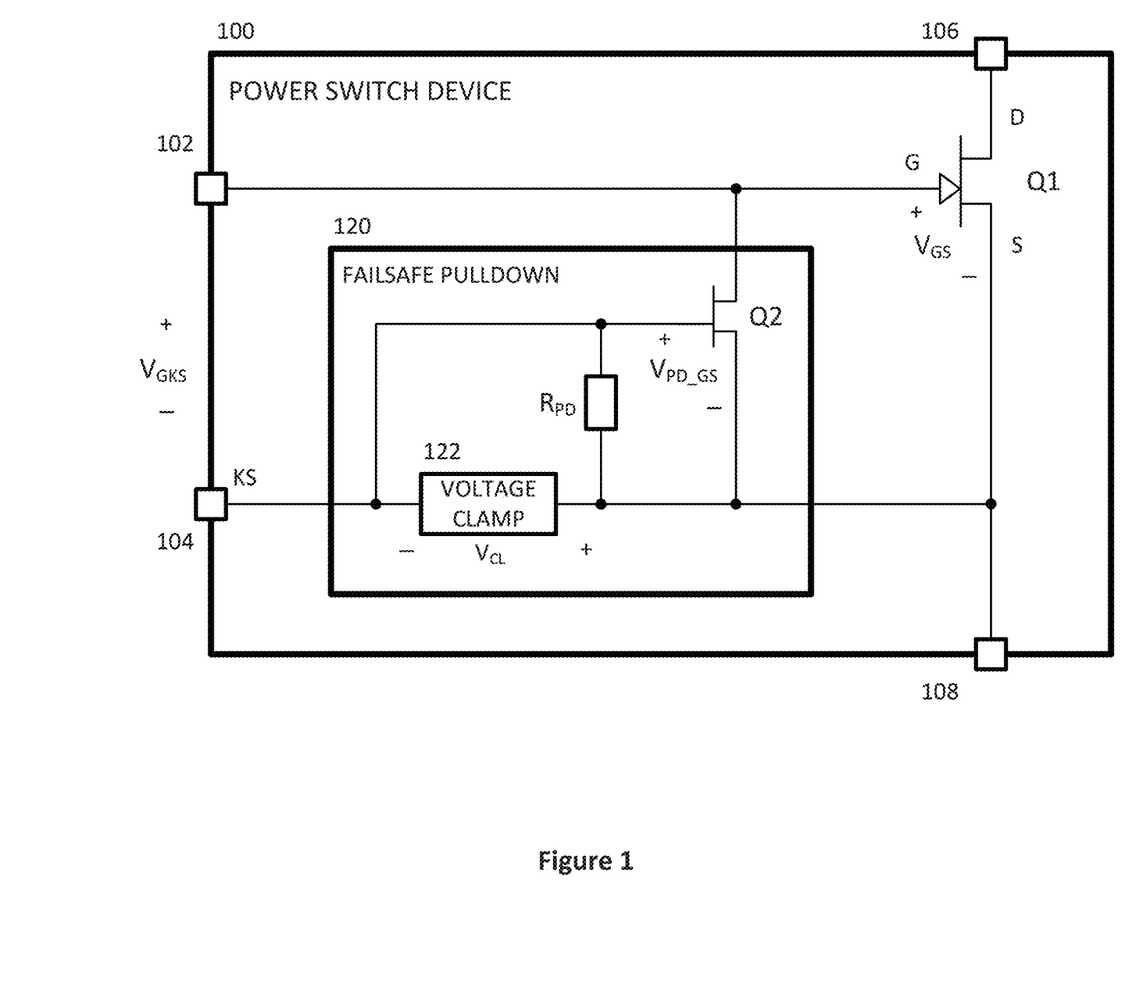
FIG. 1 illustrates a schematic diagram of a power switch device including a failsafe pulldown circuit.

FIG. 1 illustrates an embodiment of a power switch device 100 according to the invention. The power switch device 100 includes a power switch Q1, a first load terminal 106, a second load terminal 108, a control terminal 102, an effective Kelvin-source terminal 104 (henceforth termed a KS terminal for brevity), and a failsafe pulldown circuit 120. The illustrated power switch Q1 is a GaN-based GIT, which is a type of enhancement-mode HEMT. The power switch Q1 has a drain, which is connected to the first load terminal 106, a source, which is connected to the second load terminal 108, and a gate, which is connected to the control terminal 102. The KS terminal 104 is connected, via the failsafe pulldown circuit 120, to the source of the power switch Q1, and provides a reference terminal for an external driver circuit that drives the gate of the power switch Q1. (Such a driver circuit is not shown in FIG. 1, but is shown in each of FIGS. 5A, 5B, and 5C.)

The power switch Q1 is a normally-off device, but has a relatively low threshold voltage for turning on or off, e.g., in the range of 1.2 to 3.5V for a GaN-based GIT. This, in addition to the low gate capacitances of the power switch Q1, makes it susceptible to unintentional transitions to a conducting state. The failsafe pulldown circuit 120 prevents such unintentional transitions, and does so autonomously, i.e., no separate external signals are required to control the failsafe pulldown circuit 120. In particular, the failsafe pulldown circuit 120 shorts the gate and source of the power switch Q1 together, such that there is no positive control voltage $V_{GS}$ to turn on the power switch Q1, during periods when the voltage provided across the control and KS terminals 102, 104 is below a turn-on voltage for the power device 100, or when this voltage is not driven, e.g., is floating.

The failsafe pulldown circuit 120 includes a normally-on pulldown switch Q2, a voltage clamp 122, and a pulldown resistor $R_{PD}$. The normally-on pulldown switch Q2 is preferably fabricated in the same or a similar technology as the power switch Q1, and in the same die as the power switch Q1. For the illustrated example wherein the power switch Q1 is a GaN-based GIT (enhancement-mode HEMT), the pulldown switch Q2 is preferably a depletion-mode GaN-based HEMT. Such a pulldown switch Q2 is turned off (set to a blocking mode) when its gate-to-source voltage $V_{PD\_GS}$ is sufficiently negative, e.g., below a turn-off threshold voltage $V_{PD\_THR}$ that is typically in the range of −4V to −7V. Otherwise, including when zero pulldown gate-to-source voltage is applied and when no voltage is actively driven across the pulldown gate and source, the pulldown switch Q2 conducts. Locating the pulldown switch Q2 in the same die as the power switch Q1 and in close proximity to the gate and source of the power switch Q1 makes it extremely unlikely for the power switch Q1 to unintentionally be transitioned to its on state.

The voltage clamp 122 is configured to generate a pulldown gate-to-source voltage $V_{PD\_GS}$ that is below the negative threshold voltage $V_{PD\_THR}$ that is required to turn off the pulldown switch Q2, during intervals when the power switch Q1 is on (conducting). The voltage clamp 122 may be, or be modelled as, a diode having a threshold voltage. The magnitude of the forward threshold voltage for a typical diode is lower than the magnitude of the turn-off threshold voltage $V_{PD\_THR}$ of the pulldown switch Q2. Hence, the voltage clamp 122 may include several diodes cascaded (stacked) in series, so as to achieve a clamping voltage $V_{CL}$ that is required to turn-off the pulldown switch Q2, i.e., $V_{CL} > |V_{PD\_THR}|$. Example circuits for implementing the voltage clamp 122 using GaN-based diodes are described below in conjunction with FIG. 2.

The pulldown resistor $R_{PD}$ ensures that the pulldown switch Q2 is turned back on under no power/signal conditions. For example, if no voltage is being driven across the control and KS terminals 102, 104, the pulldown resistor $R_{PD}$ ensures that the pulldown gate and pulldown source are pulled to the same voltage, i.e., $V_{PD\_GS}=0$, thereby turning on the pulldown switch Q2, so as to short the power transistor gate to the power transistor source. In a preferred embodiment in which the power and pulldown switches Q1, Q2 are integrated in the same semiconductor die, the pulldown resistor $R_{PD}$ is also integrated in the same semiconductor. For the example of a GaN semiconductor die, the pulldown resistor $R_{PD}$ is also made of GaN. In particular, the pulldown resistor $R_{PD}$ may include one or more two-dimensional electron gas (2DEG) regions of the GaN semiconductor die, which is substantially a GaN HEMT without the gate.

Figure 2A:
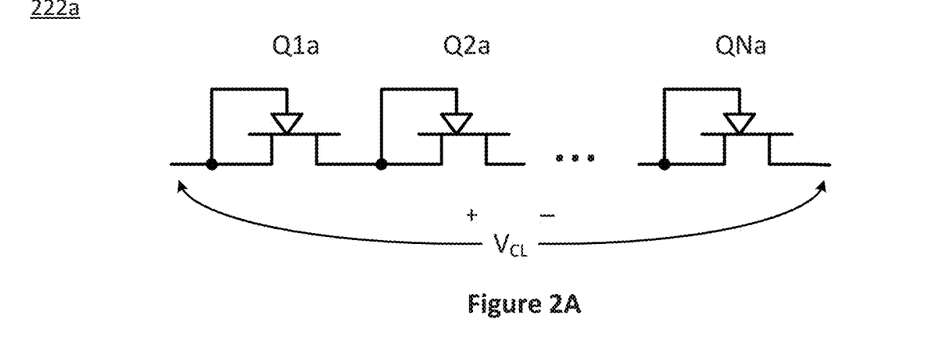
FIGS. 2A, 2B, and 2C illustrate examples and alternative circuits for the voltage clamp of the failsafe pulldown circuit.
Figure 2B:
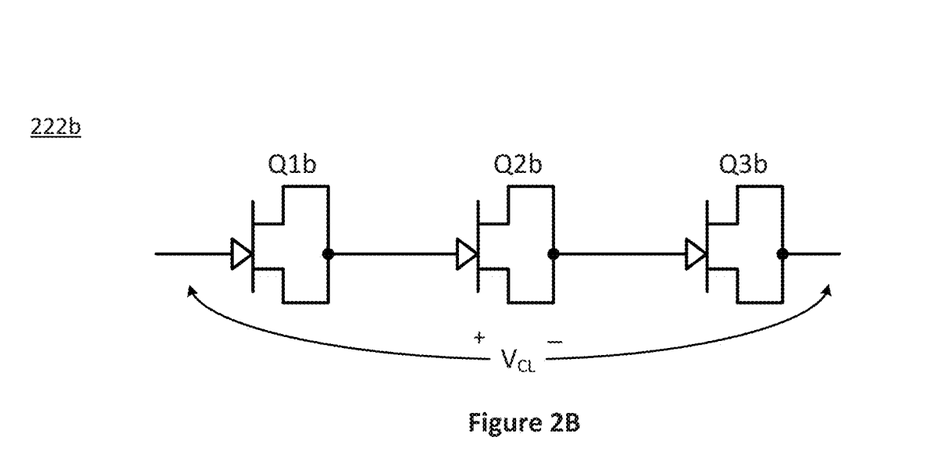
Figure 2C:
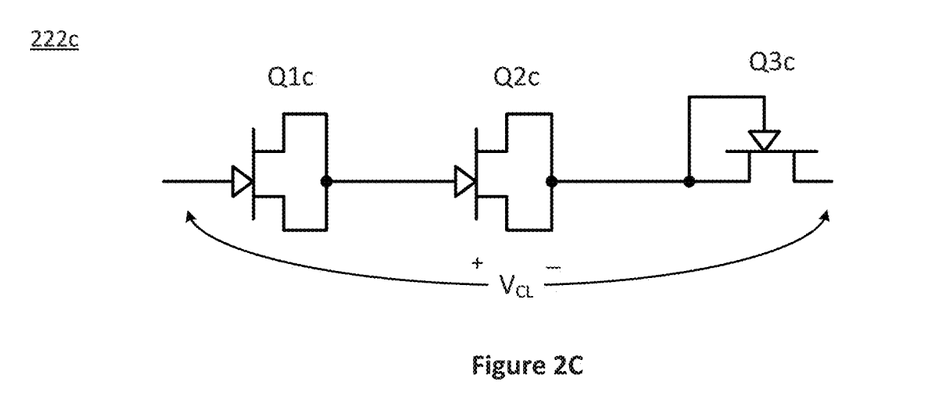

FIGS. 2A, 2B, and 2C illustrate circuits 222a, 222b, 222c that can be used for the voltage clamp 122. These circuits are each comprised of GaN transistors, and can thus be integrated in the same GaN semiconductor die as the power transistor, e.g., when it is a GaN-based GIT. The voltage clamp circuits 222a, 222b, 222c are each constructed using normally-off GaN based switches that are configured as two-terminal diodes.

FIG. 2A illustrates a voltage clamp 222a that includes multiple GaN-based GITs Q1a, . . . QNa, each of which is configured as a gated diode. Each of the gated diodes is a normally-off GaN-based switch having its gate directly tied to its source, thereby converting the switch into a two-terminal device (diode) in which the gate/source serves as an anode and the drain serves as a cathode. Such a gated diode typically has a threshold (knee) voltage of 0.9V to 1.5V. For an example in which the pulldown switch Q2 has a threshold voltage of −6V and wherein at least 1V of margin beyond the threshold is desired, N=8 of the gated diodes are needed to provide the desired clamp voltage $V_{CL} > 7V$ at a diode threshold voltage of 0.9V. Such an implementation may be undesirable due to the die size required by the numerous gated diodes Q1a, QNa, and due to the range of the threshold voltages, i.e., the clamp voltage $V_{CL}$ may range between 7.2V and 12V for N=8 gated diodes.

FIG. 2B illustrates a voltage clamp 222b that includes three GaN-based GITs Q1b, Q2b, Q3b, each of which is configured as a PN diode. Each of these PN diodes is a normally-off GaN switch with its drain and source connected, thereby converting the switch into a two-terminal device (diode) in which the gate is the anode and the drain/source is the cathode. Such a PN diode has a relatively stable threshold (knee) voltage of about 3.3V, but somewhat limited current handling compared to the gated diode. While fewer such PN diodes are required in the voltage clamp as compared to gated diodes, each of the PN diodes requires more die size to handle the same current level as a similar gated diode. To achieve a desired clamp voltage $V_{CL} > 7V$, three of the PN diodes, shown as Q1b, Q2b, Q3b, are required, thereby providing a clamp voltage $V_{CL}=3*(3.3V) =9.9V$. Such a clamp voltage may be undesirably high for some implementations.

A mixture of GaN-based gated diodes and PN diodes may be used to tune the clamp voltage $V_{CL}$ to a desired value, thereby customizing the voltage to a particular implementation, e.g., to the turn-off threshold of a depletion-mode HEMT in a particular GaN process. FIG. 2C illustrates such a mixture that includes two PN diodes Q1c, Q2c and one gated diode Q3c, which yields a clamp voltage $V_{CL}$ between 7.5 and 8.1V. This mixture provides a clamp voltage $V_{CL}$ higher than the desired 7V level described previously, while potentially consuming less die size than the voltage clamps 222a, 222b of FIGS. 2A and 2B. Other combinations of gated diodes and PN diodes may be preferred in other implementations, wherein the number of PN diodes sets a coarse (and stable) clamp voltage, and the number of gated diodes may fine tune the clamp voltage. Due to the relatively wide range of their threshold voltages, the number of gated diodes is minimized in typical implementations. While FIGS. 2A, 2B, and 2C illustrate three specific examples for implementing the voltage clamp 122, it should be recognized that other circuits are possible and that the inventive techniques described herein are not limited to the exemplary voltage clamps shown in FIGS. 2A, 2B, and 2C.

Figure 3:
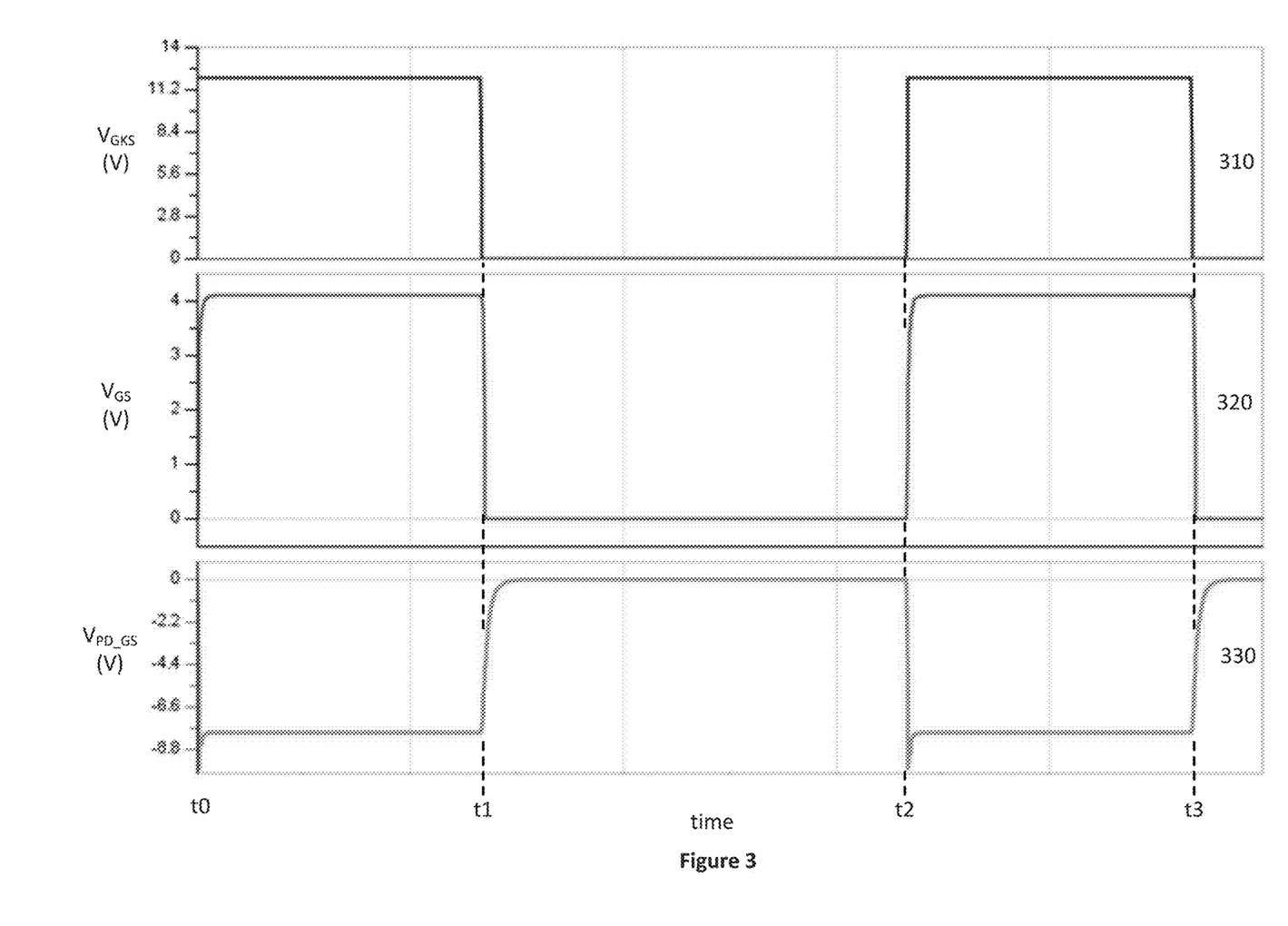
FIG. 3 illustrates an example of voltage waveforms corresponding to the power switch device of FIG. 1.

FIG. 3 illustrates basic voltage waveforms 310, 320, 330 corresponding to the operation of the power switch device 100 of FIG. 1, including a voltage clamp such as the voltage clamp 222c of FIG. 2C. The waveforms are based upon a voltage clamp 222c in which the gated diode Q3c has a threshold voltage of 1.4V, such that the overall clamp voltage $V_{CL}$=8V. The pulldown resistor $R_{PD}$ of the failsafe pulldown circuit 120 has a resistance of 1 KΩ. The first illustrated waveform 310 corresponds to the voltage $V_{GKS}$ across the control and KS terminals 102, 104, the second illustrated waveform 320 corresponds to the voltage $V_{GS}$ across the gate and source of the power switch Q1, and the third illustrated waveform 330 corresponds to the voltage $V_{PD\_GS}$ across the gate and source of the pulldown switch Q2. The waveforms 310, 320, 330 correspond to a system in which the power switch device 100 is switched at a frequency of 150 KHz, i.e., the period between times t1 and t3 is 6.67 μsec. These voltages and timings are provided merely for clarity of explanation, and it should be understood that the specific values are likely to differ in other implementations. For example, current or future GaN-based switches, or other switch types, may have different threshold voltages than presented herein, in which case the levels of the voltages used for driving power switch devices based on such other switches may differ from that shown in FIG. 3.

At time t0, an external driver (not shown in FIG. 1 for ease of illustration) drives the voltage $V_{GKS}$ to 12V, so as to turn on the normally-off power switch Q1. This voltage ($V_{GKS}$=12V) provides a gate-to-source voltage $V_{GS}$ for the power switch Q1, and is further dropped across the voltage clamp such that $V_{GKS}=V_{GS}+V_{CL}$. The voltage clamp 222c clamps the voltage across it to 8V, which corresponds to a pulldown gate-to-source voltage $V_{PD\_GS}$ of –8V, as shown in the third waveform 330 between times t0 and t1. The voltage $V_{GKS}$ that is not dropped across the voltage clamp provides a gate-to-source voltage $V_{GS}$=+4V for the normally-off power switch Q1, as shown in the second waveform 320 between times t0 and t1. Such a level is well above the turn-on threshold (e.g., 3.0) of the power switch Q1. Hence, the power switch Q1 is set to conduct between times t0 and t1. The turn-on threshold voltage may vary in other power switches, in which case a gate-to-source voltage $V_{GS}$ that is higher or lower than that shown in FIG. 3 may be preferred.

At time t1, the external driver stops supplying voltage to power switch Q1. With no voltage ($V_{GKS}$=0V) applied across the control and KS terminals 102, 104, the voltage clamp has insufficient voltage to maintain its forward biasing. Hence, the voltage clamp ceases conduction and the negative voltage across $V_{PD\_GS}$ rises back to zero. Stated alternatively, the voltage clamp effectively acts as open circuit. The pulldown resistor $R_{PD}$ drains any residual charge from the pulldown source to the pulldown gate, thus equalizing the voltages of the pulldown gate and source. This is shown at time t1 of the third waveform 330, after which the pulldown gate-to-source voltage $V_{PD\_GS}$ transitions from a voltage of –8V to 0V. With the normally-on pulldown switch Q2 driven thusly, the pulldown switch Q2 turns on thereby shorting the gate and source of the power transistor Q1, i.e., $V_{GS}$=0. As shown in the second waveform 320, this state ($V_{GS}$=0) is held until time t2. During the interval between times t1 and t2, the pulldown switch Q2 maintains the power switch Q1 in an off state, and prevents ringing or other noise from unintentionally switching on the power switch Q1.

A time t2, the external driver drives the voltage $V_{GKS}$ to 12V, and the above sequence is repeated.

Figure 4:
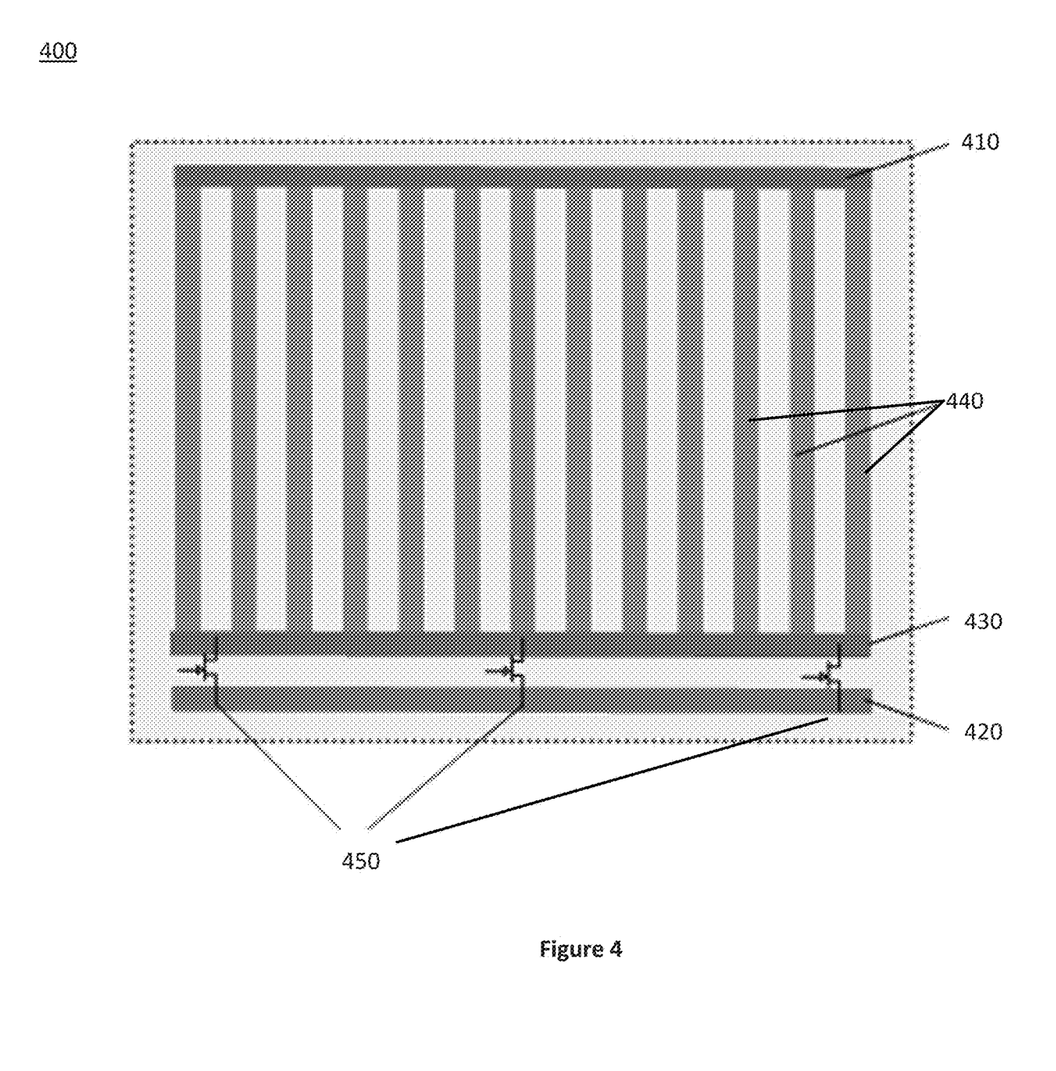
FIG. 4 illustrates a layout for the power switch device of FIG. 1, when the power switch device is integrated in a GaN die.

FIG. 4 illustrates a layout 400 for a power switch device as described above in relation to FIG. 1, including an enhancement-mode power switch, such as Q1, and a depletion-mode pulldown switch, such as Q2. A drain rail 410 is provided near one edge of the layout 400, and a source rail 420 is provided at an opposite edge of the layout 400. These rails 410, 420 may be metallizations that connect to a conduction path, e.g., a two-dimensional electron gas (2DEG) region, formed at the heterojunction between GaN and AlGaN layers. Multiple such conduction paths are shown in the layout 400 as GaN fingers 440 that run orthogonal to the drain and source rails 410, 420. (Only three of the GaN fingers 440 are explicitly denoted in the layout 400, but more are shown. While not shown for ease of illustration, the GaN fingers 440 connect to the drain and source rails 410, 420.) A gate rail 430 runs parallel to the source and drain rails 410, 420, and is located near the source rail 420. The gate rail 430 may be a metallization that is connected to each of the GaN fingers 440 via a p-doped GaN layer for each GaN finger. The gate rail 430 provides control over the conduction paths of the GaN fingers 440, whereas the p-doped GaN material between the gate rail 430 and the GaN fingers 440 raises the turn-on threshold of the power switch, so as to convert it into an enhancement-mode (normally-off) device.

As described previously, a pulldown switch, such as the pulldown switch Q2 of FIG. 1, switchably connects the gate and source of the power switch Q1. The pulldown switch is preferably located as close as feasible to the gate and source of the power switch. The layout 400 shows a distributed pulldown switch 450 between the gate and source rails 430, 420 of the power switch. For example, the distributed pulldown switch 450 may be a depletion-mode (normally-on) HEMT fabricated in the same GaN semiconductor die as the power switch, and may include multiple cells (e.g., GaN fingers). As illustrated, the pulldown switch has a pulldown drain coupled to the gate rail 430 of the power switch at three locations, and a pulldown source coupled to the source rail 420 at three locations. Each of the three illustrated parts of the pulldown switch 450 may correspond to a cell, wherein each cell has a conduction path (e.g., 2DEG region), and the cells are distributed along substantially the entire length of the gate and source rails 430, 420. In addition to providing support for higher current levels than a single-cell HEMT, the distributed characteristic of the illustrated pulldown switch 450 with multiple contact points and multiple conduction paths provides a more robust clamping of the power switch gate to the power switch source, such that there is less potential for anomalous voltage perturbations (ringing, noise) to couple onto the power switch gate (e.g., the gate rail 430).

In addition to the power switch Q1 and the pulldown switch Q2, the power switch device 100 of FIG. 1 also includes a voltage clamp 122 and a pulldown resistor $R_{PD}$, which are advantageously also integrated into the GaN die. For ease of illustration, the voltage clamp 122 and the pulldown resistor $R_{PD}$ are not shown in the layout 400 of FIG. 4. These components are preferably located in the GaN die in between the gate rail 430 and the source rail 420, or in a region of the GaN die that is disposed on the side of the source rail 420 that is opposite to the gate rail 430.

Figure 5A:
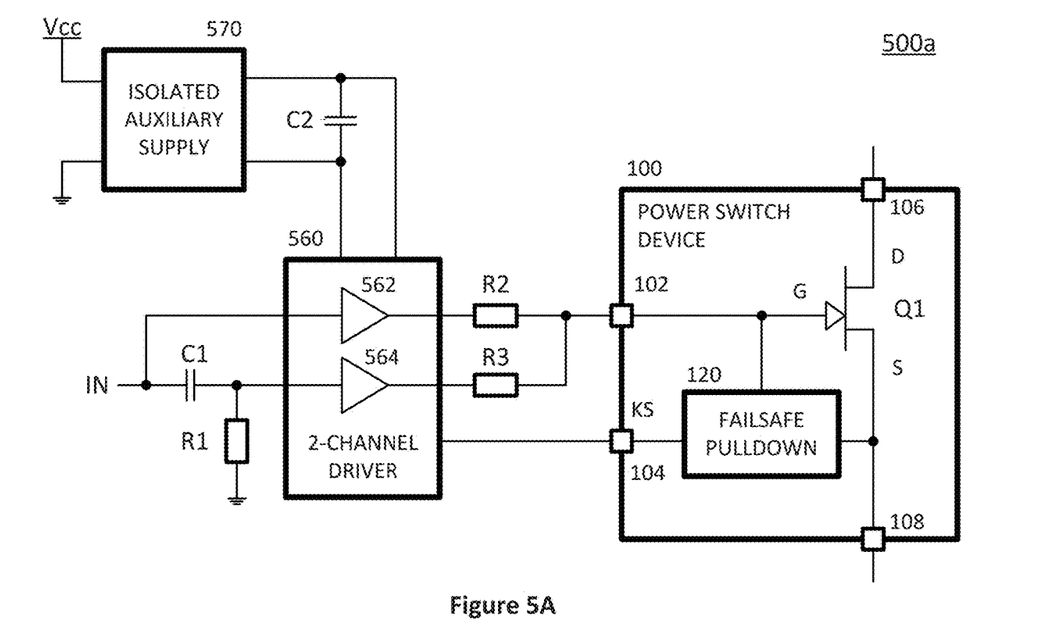
FIGS. 5A, 5B, and 5C illustrate schematic diagrams of circuits for driving the power switch device of FIG. 1.
Figure 5B:
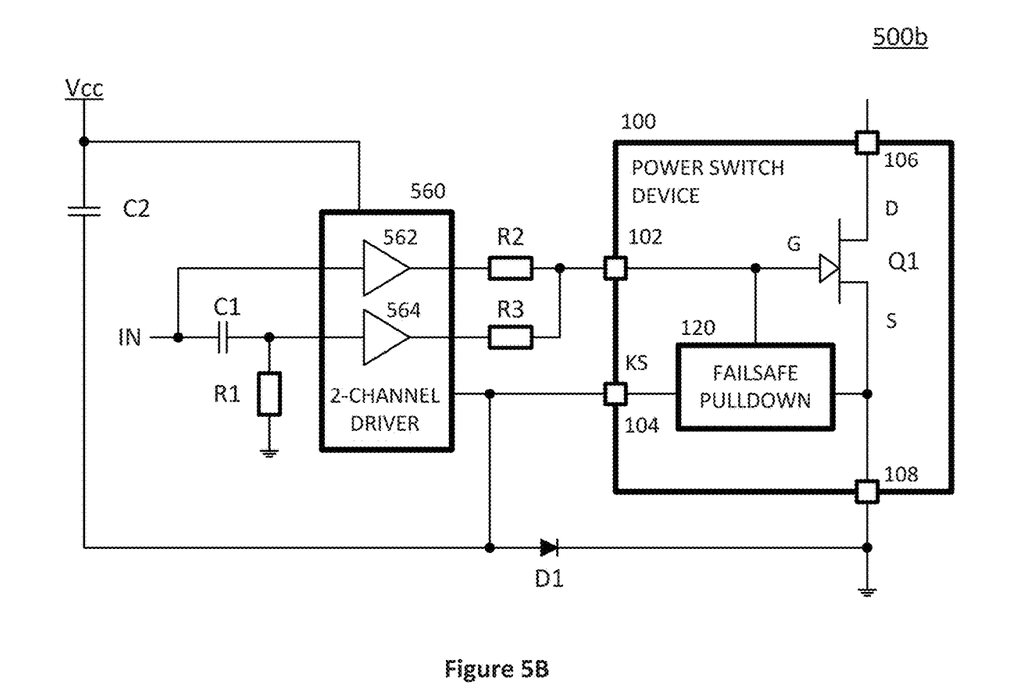
Figure 5C:
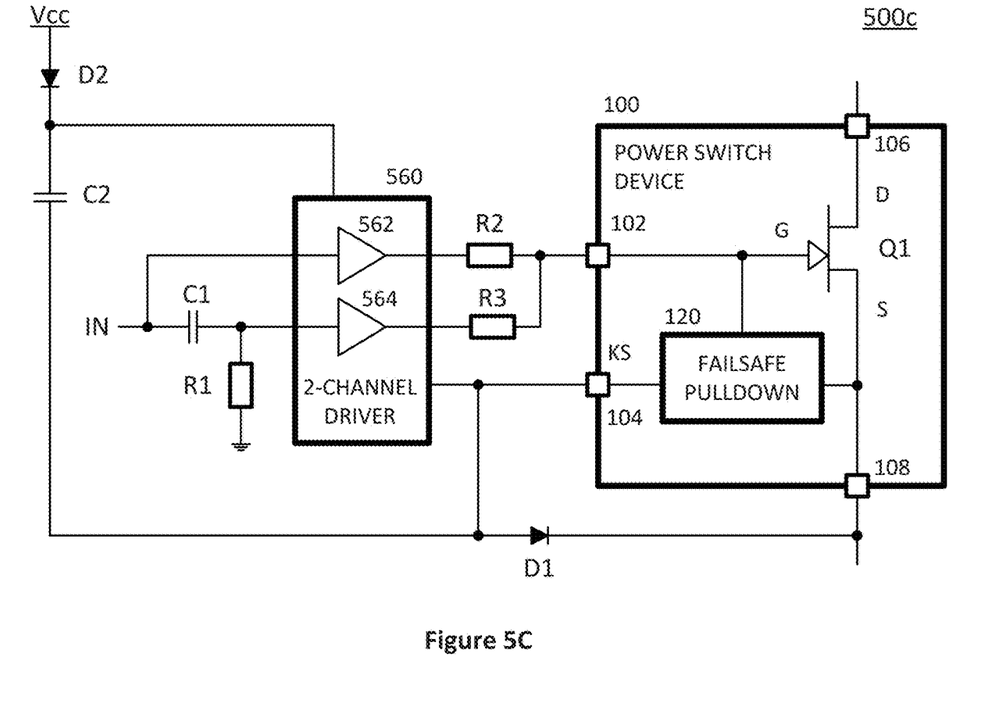

FIGS. 5A, 5B and 5C illustrate schematic diagrams for electronic power switch device systems 500a, 500b, 500c, including exemplary drivers. The power switch device 100 of these figures is substantially the same as that of FIG. 1. The system 500a of FIG. 5A uses an isolated auxiliary supply 570 and a two-channel driver 560 to drive the power switch device 100. The systems 500b, 500c of FIGS. 5B and 5C use a supply capacitor C2, and do not require an isolated supply, to power a two-channel driver 560, which drives the power switch device 100. The system 500b supports a ground-referenced power switch device 100, whereas the system 500c supports a power switch device 100 having a floating source, as occurs in a scenario in which the power switch device 100 is the high-side switch of a half bridge.

The power switch device system 500a of FIG. 5A includes the power switch device 100, a two-channel driver 560, and an isolated auxiliary supply 570. The isolated auxiliary supply 570 is connected to a power supply rail Vcc and a ground. The isolated auxiliary supply 570 typically includes a transformer and switching circuitry, so as to provide an output voltage across a filter capacitor C2. (For ease of illustration and because isolated supplies are generally known, transformer and switching circuitry are not shown in FIG. 5A. Such a transformer may provide a step up, step down, or unity gain of the input voltage Vcc.) This output voltage may be level shifted relative to the ground reference, e.g., to support an application in which the source (S) of the power switch device 100 is not at a ground reference. The reference level for the voltage output from the isolated auxiliary supply 570 is set by the two-channel driver 560 which, in turn, may set this reference level based on the voltage of the connection to the KS terminal 104.

The two-channel driver 560 includes first and second driver channels 562, 564 for driving a control signal to the control terminal 102 of the power switch device 100, which corresponds to the gate (G) of the power switch Q1. An input signal IN, which is typically a digital pulse-width-modulated (PWM) voltage waveform, controls when the channels 562, 564 are turned on and off. The voltages output from the driver channels 562, 564 are referenced to the voltage of the KS terminal 104, and have active voltage levels that are based upon the output of the isolated auxiliary supply 570. A GaN-based GIT is preferably provided with a high-current initial turn-on pulse to transition the GIT to its on state, and a lower current level to maintain the on state. A capacitor-resistor circuit C1, R1 generates such an initial pulse condition, and the initial turn-on pulse is driven by the second driver channel 564 and the resistor R3. Subsequently, the first driver channel 562 and the resistor R2 provide a lower current level to maintain the on state until the input signal IN commands the driver 560 to switch the power switch device 100 to its off state. The resistors R2 and R3 are current-limiting resistors that may be tuned to provide desired turn-on and steady-state drive currents for the power switch device 100. Resistor R3 typically has a smaller resistance than resistor R2.

The power switch device system 500b of FIG. 5B is similar to the system 500a of FIG. 5A, except that its two-channel driver 560 does not require an isolated power supply and is instead powered from a voltage supply Vcc in conjunction with a supply capacitor C2. The system 500b may support a ground-referenced voltage at the second load terminal 108.

Power is supplied to the two-channel driver 560, via supply rail Vcc and supply capacitor C2, in a manner similar to that used for powering a conventional power switch, e.g., a power MOSFET or an Insulated-Gate Bipolar Transistor (IGBT), except for inclusion of a diode D1 connecting the supply capacitor C2 and KS terminal 104 to the second load terminal 108 (source of power switch Q1). During intervals when the power switch device 100 is turned off, the supply capacitor C2 is charged, from Vcc, to at least a turn-on voltage level required for turning on the power switch device 100, wherein this turn-on voltage is applied across the control terminal 102 (gate of power switch Q1) and the KS terminal 104. To accomplish such charging, the negative side of the supply capacitor C2 must be connected to an appropriate reference. The diode D1 forces current to flow through the failsafe pulldown circuit 120 instead of through the source terminal (S) back to the supply capacitor C2. The diode D1 provides an alternative path for connecting the negative side of the supply capacitor C2 to the power switch source (S), so that the supply capacitor C2 may be charged. The diode D1 also prevents current flow from the second load terminal 108 to the KS terminal 104, so that the failsafe pulldown 120 can operate as described previously. During intervals when the power switch device 100 is turned on, the failsafe pulldown circuit 120 provides a negative voltage at the KS terminal 104, relative to the power switch source (S), such that the diode D1 is not forward biased and does not affect the voltage at the KS terminal 104.

FIG. 5C illustrates a schematic diagram for a system 500c making use of a bootstrap driver circuit. This circuitry for driving the power switch device 100 is similar to bootstrap driver circuitry that may be used in driving other transistors including, e.g., conventional MOSFETs or IGBTs, except for the diode D1. The diode D1 is configured in the same manner as in the system 500b of FIG. 5B, and provides a path to the second load terminal 108 (and the source of the power switch Q1) for charging the supply capacitor C2. A bootstrap diode D2 isolates the supply capacitor C2 when the voltage at the positive side of the supply capacitor C2 rises to a level near the voltage of Vcc. This allows the voltage reference, e.g., the voltage at the negative side of the supply capacitor C2, to float above a ground reference while a drive voltage is maintained across the supply capacitor C2.

The system 500c may be, e.g., part of a half-bridge circuit in which the power switch device 100 serves as the high-side switch. When a low-side switch (not shown for ease of illustration) is turned on, the second load terminal 108 is pulled close to ground. (The high-side power switch device 100 is off during this interval.) The negative side of supply capacitor C2 is set to a low voltage level, which is the ground reference plus any voltage drop across the diode D1 (e.g., 0.7V) and the low-side switch. Current flows from the Vcc rail, via the bootstrap diode D2, to charge the supply capacitor C2. The resultant voltage across supply capacitor C2 will be the voltage of Vcc less the drops across the diodes D1, D2 and the low-side switch. Once the low-side switch is turned off, the second load terminal 108 is no longer coupled to ground, and may float to a higher voltage. The two-channel driver 560 turns on the power switch device 100 by applying the voltage from supply capacitor C2 across the control terminal 102 and the KS terminal 104.

The systems 500a, 500b, 500c of FIGS. 5A, 5B, and 5C merely provide example circuits for driving the power switch device 100. Other driving circuits are possible, and may be preferred in some applications. It is noteworthy that conventional two-voltage-level driving circuits, as used with conventional MOSFETs and IGBTs, may be used for driving the power switch device 100. The complex circuitry typically used for driving GaN-based GITs may thus be avoided.

Although the present disclosure is not so limited, the following numbered examples demonstrate one or more aspects of the disclosure.

Example 1

A power device that includes a normally-off power transistor, first and second load terminals, a control terminal, an effective Kelvin-source (KS) terminal, and a failsafe pulldown circuit. The first load terminal is electrically connected to a drain of the power transistor, the second load terminal is electrically connected to a source of the power transistor, and the control terminal is electrically connected to a gate of the power transistor. The failsafe pulldown circuit comprises a normally-on pulldown transistor and a pulldown control circuit for controlling the pulldown transistor. The pulldown transistor has a pulldown gate, a pulldown source and a pulldown drain, and is configured to short the power transistor gate to the power transistor source, unless a turn-on voltage of the power device is applied across the control terminal and the KS terminal. The pulldown control circuit is connected between the pulldown gate and the pulldown source, and is configured to autonomously apply a negative voltage to the pulldown gate, relative to the pulldown source, when a turn-on voltage is applied between the control and the KS terminals. The pulldown control circuit is further configured to autonomously discharge the negative voltage when the turn-on voltage is not applied between the control and KS terminals. Hence, the failsafe pulldown circuit prevents the normally-off power transistor from conducting when the power transistor is intended to be held in its off (non-conducting, blocking) state.

Example 2

The power device of example 1, wherein the pulldown control circuit includes a resistor coupled between the pulldown gate and the pulldown source, so as to autonomously discharge the negative voltage when the turn-on voltage is not applied between the control terminal and the KS terminal.

Example 3

The power device of example 1, wherein the pulldown control circuit comprises a voltage clamp coupled between the pulldown source and the pulldown gate, so as to apply the negative voltage to the pulldown gate relative to the pulldown source when a voltage that is higher than a required threshold voltage to turn on the normally-off power transistor and turn off the pull down switch is being applied between the control terminal and the KS terminal.

Example 4

The power device of example 3, wherein the voltage clamp is comprised of one or more diodes coupled in series, and a combined threshold voltage of the one or more diodes provides the negative voltage applied to the pulldown gate, relative to the pulldown source, such that the negative voltage is lower than a negative turn-off threshold of the normally-on pulldown transistor.

Example 5

The power device of example 1, wherein the normally-off power transistor is an enhancement-mode Gallium Nitride (GaN) High Electron Mobility Transistor (HEMT).

Example 6

The power device of example 5, wherein the enhancement-mode GaN HEMT is a Gate Injection Transistor (GIT).

Example 7

The power device of example 5, wherein the normally-on pulldown transistor is a depletion-mode GaN HEMT.

Example 8

The power device of example 1, wherein the turn-on voltage is a positive voltage that equals or exceeds a sum of a turn-on threshold voltage of the normally-off power transistor and a magnitude of a turn-off threshold voltage of the normally-on pulldown transistor. The normally-on pulldown transistor is arranged to short the gate to the source when a voltage applied across the control terminal and the KS terminal is smaller than the magnitude of the turn-off threshold voltage of the normally-on pulldown transistor. The pulldown control circuit is configured to autonomously discharge the negative voltage when a voltage applied across the control terminal and the KS terminal is smaller than the magnitude of the turn-off threshold voltage of the normally-on pulldown transistor.

Example 9

An electronic switch device that includes a normally-off power transistor, first and second load terminals, a control terminal, an effective Kelvin-source (KS) terminal, and a failsafe pulldown circuit. The first load terminal is electrically connected to a drain of the power transistor, the second load terminal is electrically connected to a source of the power transistor, and the control terminal is electrically connected to a gate of the power transistor. The power transistor and the failsafe pulldown circuit are integrated on the same semiconductor die. The failsafe pulldown circuit comprises a normally-on pulldown transistor and a pulldown control circuit for controlling the pulldown transistor. The pulldown transistor has a pulldown gate, a pulldown source and a pulldown drain, and is configured to short the power transistor gate to the power transistor source, unless a turn-on voltage of the power device is applied across the control terminal and the KS terminal. The pulldown control circuit is connected between the pulldown gate and the pulldown source, and is configured to autonomously apply a negative voltage to the pulldown gate, relative to the pulldown source, when a turn-on voltage is applied between the control and the KS terminals. The pulldown control circuit is further configured to autonomously discharge the negative voltage when the turn-on voltage is not applied between the control and KS terminals. Hence, the failsafe pulldown circuit prevents the normally-off power transistor from conducting when the power transistor is intended to be held in its off (non-conducting, blocking) state.

Example 10

The electronic switch device of example 9, wherein the semiconductor die comprises a group III-V material.

Example 11

The electronic switch device of example 10, wherein the group III-V material is Gallium Nitride (GaN).

Example 12

The electronic switch device of example 11, wherein the normally-off power transistor is an enhancement-mode GaN High Electron Mobility Transistor (HEMT).

Example 13

The power device of example 12, wherein the enhancement-mode GaN HEMT is a Gate Injection Transistor (GIT).

Example 14

The electronic switch device of example 12, wherein the normally-on pulldown transistor is a depletion-mode GaN HEMT.

Example 15

The electronic switch device of example 12, wherein the pulldown control circuit comprises a voltage clamp coupled between the pulldown source and the pulldown gate, so as to provide the negative voltage, and the voltage clamp comprises one or more GaN-HEMT-based diodes.

Example 16

The electronic switch device of example 15, wherein the one or more GaN-HEMT-based diodes comprise at least one of a gated diode and a PN diode. The gated diode comprises a normally-off GaN HEMT in which its source and its gate are coupled together to form an anode, and a drain of said GaN HEMT forms a cathode. The PN diode comprises a normally-off GaN HEMT in which its source and its drain are coupled together to form an cathode, and a gate of said GaN HEMT forms an anode.

Example 17

The electronic switch device of example 15, wherein the one or more GaN-HEMT-based diodes are coupled in series, and are configured such that a combined threshold voltage of the GaN-HEMT-based diodes provides the negative voltage applied to the pulldown gate, relative to the pulldown source, such that the negative voltage is lower than a negative turn-off threshold of the normally-on pulldown transistor.

Example 18

The electronic switch device of example 14, wherein the pulldown control circuit comprises a resistor coupled between the pulldown gate and the pulldown source, so as to autonomously discharge the negative voltage when the turn-on voltage is not applied between the control terminal and the KS terminal, wherein the resistor is formed in the GaN semiconductor die.

Example 19

The electronic switch device of example 18, wherein the resistor is comprised of a two-dimensional electron gas (2DEG) region of the GaN semiconductor die.

Example 20

The electronic switch device of example 9, wherein the turn-on voltage is a voltage that equals or exceeds a sum of a turn-on threshold voltage of the normally-off power transistor and a magnitude of a turn-on threshold voltage of the normally-on pulldown transistor.

Example 21

The electronic switch device of example 9, wherein a channel of the normally-on pulldown transistor is interposed between a metallization of the gate of the normally-off power transistor and a metallization of the source of the normally-off power transistor.

Example 22

The electronic switch device of example 9, wherein the normally-off power transistor comprises: multiple fingers, each comprising a channel region; a gate rail metallization connected to gates for each of the multiple fingers; and a source rail metallization connected to each of the multiple fingers, wherein the normally-on pulldown transistor comprises multiple pulldown channels, each of which is interposed between the gate rail metallization and the source rail metallization, and wherein the multiple pulldown channels are distributed along a length of the gate rail metallization and the source rail metallization.

Example 23

A power device that includes a normally-off power transistor, first and second load terminals, a control terminal, an effective Kelvin-source (KS) terminal, and a failsafe pulldown circuit. The first load terminal is electrically connected to a drain of the power transistor, the second load terminal is electrically connected to a source of the power transistor, and the control terminal is electrically connected to a gate of the power transistor. The failsafe pulldown circuit comprises a normally-on pulldown transistor and a pulldown control circuit. The normally-on pulldown transistor comprises a pulldown source, a pulldown drain and a pulldown gate, and is coupled between the gate and the source of the normally-off power transistor. The pulldown control circuit is connected between the pulldown gate and the pulldown source, and comprises a resistor and a voltage clamp coupled in parallel between the pulldown gate and the pulldown source.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power device, comprising:
   a normally-off power transistor comprising a gate, a source, and a drain;
   a control terminal electrically connected to the gate;
   a first load terminal electrically connected to the drain;
   a second load terminal electrically connected to the source;
   a Kelvin-source (KS) terminal; and
   a failsafe pulldown circuit comprising:
      a normally-on pulldown transistor configured to short the gate to the source when no voltage is applied across the control terminal and the KS terminal, and comprising a pulldown gate, a pulldown source, and a pulldown drain; and
      a pulldown control circuit connected between the pulldown gate and the pulldown source, and configured to autonomously apply a negative voltage to the pulldown gate, relative to the pulldown source, when a turn-on voltage is applied between the control terminal and the KS terminal, and to autonomously discharge the negative voltage when the turn-on voltage is not applied between the control terminal and the KS terminal.

2. The power device of claim 1, wherein the pulldown control circuit comprises:
   a resistor coupled between the pulldown gate and the pulldown source, so as to autonomously discharge the negative voltage when the turn-on voltage is not applied between the control terminal and the KS terminal.

3. The power device of claim 1, wherein the pulldown control circuit comprises:
   a voltage clamp coupled between the pulldown source and the pulldown gate, so as to apply the negative voltage to the pulldown gate relative to the pulldown source when a voltage that is higher than a required threshold voltage to turn on the normally-off power transistor and to turn off the pull down switch is being applied between the control terminal and the KS terminal.

4. The power device of claim 3, wherein the voltage clamp is comprised of one or more diodes coupled in series, and a combined threshold voltage of the one or more diodes provides the negative voltage applied to the pulldown gate, relative to the pulldown source, such that the negative voltage is lower than a negative turn-off threshold of the normally-on pulldown transistor.

5. The power device of claim 1, wherein the normally-off power transistor is an enhancement-mode Gallium Nitride (GaN) High Electron Mobility Transistor (HEMT).

6. The power device of claim 5, wherein the enhancement-mode GaN HEMT is a Gate Injection Transistor (GIT).

7. The power device of claim 5, wherein the normally-on pulldown transistor is a depletion-mode GaN HEMT.

8. The power device of claim 1, wherein the turn-on voltage is a positive voltage that equals or exceeds a sum of a turn-on threshold voltage of the normally-off power transistor and a magnitude of a turn-off threshold voltage of the normally-on pulldown transistor, wherein the normally-on pulldown transistor is arranged to short the gate to the source when a voltage applied across the control terminal and the KS terminal is smaller than the magnitude of the turn-off threshold voltage of the normally-on pulldown transistor, and the pulldown control circuit is configured to autonomously discharge the negative voltage when a voltage applied across the control terminal and the KS terminal is smaller than the magnitude of the turn-off threshold voltage of the normally-on pulldown transistor.

9. An electronic switch device, comprising:
   a normally-off power transistor integrated in a semiconductor die and comprising a gate, a source, and a drain;
   a control terminal that is electrically connected to the gate;
   a first load terminal that is electrically connected to the drain;
   a second load terminal that is electrically connected to the source;
   a Kelvin-source (KS) terminal; and
   a failsafe pulldown circuit integrated in the same semiconductor die as the normally-off power transistor and comprising:
      a normally-on pulldown transistor configured to short the gate to the source when no voltage is applied across the control terminal and the KS terminal, and comprising a pulldown gate, a pulldown source, and a pulldown drain; and
      a pulldown control circuit connected between the pulldown gate and the pulldown source, and configured to autonomously apply a negative voltage to the pulldown gate, relative to the pulldown source, when a turn-on voltage is applied between the control terminal and the KS terminal, and to autonomously discharge the negative voltage when the turn-on voltage is not applied between the control terminal and the KS terminal.

10. The electronic switch device of claim 9, wherein the semiconductor die comprises a group III-V material.

11. The electronic switch device of claim 10, wherein the group III-V material is Gallium Nitride (GaN).

12. The electronic switch device of claim 11, wherein the normally-off power transistor is an enhancement-mode GaN High Electron Mobility Transistor (HEMT).

13. The electronic switch device of claim 12, wherein the enhancement-mode GaN HEMT is a Gate Injection Transistor (GIT).

14. The electronic switch device of claim 13, wherein the normally-on pulldown transistor is a depletion-mode GaN HEMT.

15. The electronic switch device of claim 12, wherein the pulldown control circuit comprises a voltage clamp coupled between the pulldown source and the pulldown gate, so as to provide the negative voltage, and the voltage clamp comprises one or more GaN-HEMT-based diodes.

16. The electronic switch device of claim 15, wherein the one or more GaN-HEMT-based diodes comprise at least one of:
   a gated diode, in which a source and a gate of a normally-off GaN HEMT are coupled together to form an anode, and a drain of said GaN HEMT forms a cathode, and a PN diode, in which a source and a drain of a normally-off GaN HEMT are coupled together to form an cathode, and a gate of said GaN HEMT forms an anode.

17. The electronic switch device of claim 15, wherein the one or more GaN-HEMT-based diodes are coupled in series, and are configured such that a combined threshold voltage of the GaN-HEMT-based diodes provides the negative voltage applied to the pulldown gate, relative to the pulldown source, such that the negative voltage is lower than a negative turn-off threshold of the normally-on pulldown transistor.

18. The electronic switch device of claim 14, wherein the pulldown control circuit comprises:
   a resistor coupled between the pulldown gate and the pulldown source, so as to autonomously discharge the negative voltage when the turn-on voltage is not applied between the control terminal and the KS terminal, wherein the resistor is formed in the GaN semiconductor die.

19. The electronic switch device of claim 18, wherein the resistor is comprised of a two-dimensional electron gas (2DEG) region of the GaN semiconductor die.

20. The electronic switch device of claim 9, wherein the turn-on voltage is a voltage that equals or exceeds a sum of a turn-on threshold voltage of the normally-off power transistor and a magnitude of a turn-on threshold voltage of the normally-on pulldown transistor.

21. The electronic switch device of claim 9, wherein a channel of the normally-on pulldown transistor is interposed between a metallization of the gate of the normally-off power transistor and a metallization of the source of the normally-off power transistor.

22. The electronic switch device of claim 9, wherein the normally-off power transistor comprises:
   multiple fingers, each comprising a channel region;
   a gate rail metallization connected to gates for each of the multiple fingers; and
   a source rail metallization connected to each of the multiple fingers,
   wherein the normally-on pulldown transistor comprises multiple pulldown channels, each of which is interposed between the gate rail metallization and the source rail metallization, and wherein the multiple pulldown channels are distributed along a length of the gate rail metallization and the source rail metallization.

23. A power device, comprising:
   a normally-off power transistor comprising a gate, a source, and a drain;
   a control terminal electrically connected to the gate;
   a first load terminal electrically connected to the drain;
   a second load terminal electrically connected to the source;
   a Kelvin-source (KS) terminal; and
   a failsafe pulldown circuit comprising:
      a normally-on pulldown transistor comprising a pulldown source, a pulldown drain and a pulldown gate, and coupled between the gate and the source; and
      a pulldown control circuit connected between the pulldown gate and the pulldown source, and comprising a resistor and a voltage clamp coupled in parallel between the pulldown gate and the pulldown source.

* * * * *